United States Patent
Choi et al.

(10) Patent No.: US 9,935,207 B2
(45) Date of Patent: Apr. 3, 2018

(54) TUNNELING DIODE USING GRAPHENE-SILICON QUANTUM DOT HYBRID STRUCTURE AND METHOD OF MANUFACTURING THE SAME

(71) Applicant: UNIVERSITY-INDUSTRY COOPERATION GROUP OF KYUNG HEE UNIVERSITY, Yongin-si, Gyeonggi-do (KR)

(72) Inventors: Suk Ho Choi, Suwon-si (KR); Dong Hee Shin, Cheonan-si (KR); Sung Kim, Suwon-si (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 0 days.

(21) Appl. No.: 15/501,514

(22) PCT Filed: Oct. 14, 2014

(86) PCT No.: PCT/KR2014/009605
§ 371 (c)(1),
(2) Date: Feb. 3, 2017

(87) PCT Pub. No.: WO2016/027925
PCT Pub. Date: Feb. 25, 2016

(65) Prior Publication Data
US 2017/0229589 A1   Aug. 10, 2017

(30) Foreign Application Priority Data

Aug. 21, 2014 (KR) .................. 10-2014-0108713

(51) Int. Cl.
*H01L 29/88* (2006.01)
*C01B 33/023* (2006.01)
(Continued)

(52) U.S. Cl.
CPC .......... *H01L 29/88* (2013.01); *C01B 31/0453* (2013.01); *C01B 33/023* (2013.01);
(Continued)

(58) Field of Classification Search
CPC ......... H01L 21/02518; H01L 29/66007; H01L 29/66015
See application file for complete search history.

(56) References Cited

U.S. PATENT DOCUMENTS

2013/0022811 A1* 1/2013 Ahn .................... C23C 16/0272
428/336
2014/0151631 A1 6/2014 Duesberg et al.

FOREIGN PATENT DOCUMENTS

JP      2000-133795 A    5/2000
KR   10-2012-0059063 A   6/2012
KR      10-1257492 B1    4/2013

OTHER PUBLICATIONS

Chun-Chung Chen, et al., "Graphene-Silicon Schottky Diodes", Nano Letter, 2011, pp. 1863-1867, vol. 11, No. 5.
(Continued)

*Primary Examiner* — Cheung Lee
(74) *Attorney, Agent, or Firm* — Sughrue Mion, PLLC

(57) ABSTRACT

Disclosed is a tunneling diode, which includes a graphene-silicon quantum dot hybrid structure, having improved performance and electrical characteristics by controlling the sizes of silicon quantum dots and the doping concentration of graphene. The ideal tunneling diode of the present disclosure may be utilized in diode-based optoelectronic devices.

2 Claims, 12 Drawing Sheets

(51) Int. Cl.
  *C01B 31/04*  (2006.01)
  *H01L 29/16*  (2006.01)
  *H01L 29/15*  (2006.01)
  *H01L 31/0352*  (2006.01)
  *H01L 31/18*  (2006.01)
  *B82Y 30/00*  (2011.01)
  *B82Y 40/00*  (2011.01)

(52) U.S. Cl.
  CPC .......... *H01L 29/15* (2013.01); *H01L 29/1606* (2013.01); *H01L 31/035218* (2013.01); *H01L 31/1804* (2013.01); *B82Y 30/00* (2013.01); *B82Y 40/00* (2013.01); *C01B 2204/22* (2013.01); *C01P 2006/40* (2013.01); *Y10S 977/734* (2013.01); *Y10S 977/774* (2013.01); *Y10S 977/814* (2013.01); *Y10S 977/843* (2013.01); *Y10S 977/896* (2013.01); *Y10S 977/932* (2013.01)

(56) References Cited

OTHER PUBLICATIONS

Ali Fattah, et al., "Graphene/Silicon Heterojunction Schottky Diode for Vapors Sensing Using Impedance Spectroscopy", small 2014, DOI: 10.1002/smll.201400691, 2014, pp. 1-7.
International Search Report for PCT/KR2014/009605 dated May 8, 2015 [PCT/ISA/210].
Written Opinion for PCT/KR2014/009605 dated May 8, 2015 [PCT/ISA/237].
Korean Notice of Allowance for 10-2014-0108713 dated Feb. 4, 2016.

\* cited by examiner

FIG. 9
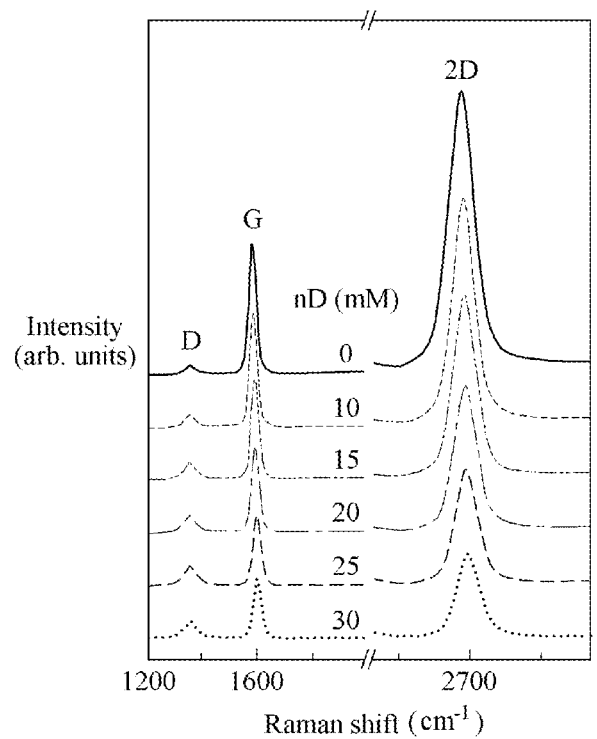
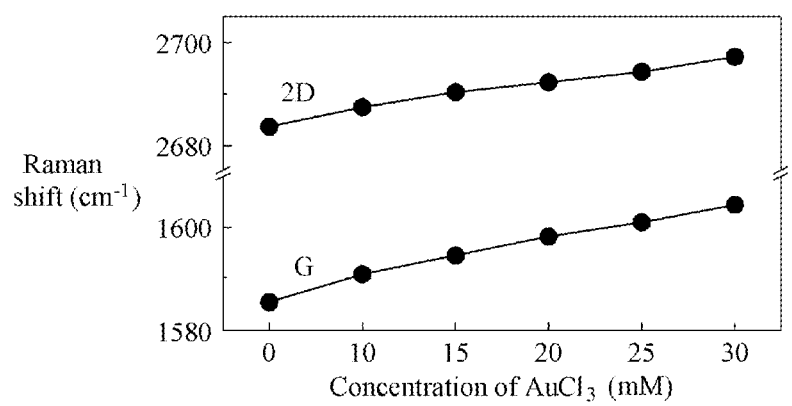
FIG. 10

TUNNELING DIODE USING GRAPHENE-SILICON QUANTUM DOT HYBRID STRUCTURE AND METHOD OF MANUFACTURING THE SAME

CROSS-REFERENCE TO RELATED APPLICATION

This application claims the priority benefit of Korean Patent Application No. 10-2014-0108713, filed on Aug. 21, 2014 in the Korean Intellectual Property Office, the disclosure of which is incorporated herein by reference.

BACKGROUND OF THE INVENTION

Field of the Invention

The present disclosure relates to a tunneling diode, which includes a graphene-silicon quantum dot hybrid structure, having improved performance and electrical characteristics by controlling the sizes of silicon quantum dots and the doping concentration of graphene, and a method of manufacturing the same.

Description of the Related Art

Graphene, which has superior optical performance as well as high electrical conductivity, has been increasingly utilized in next-generation displays, such as flexible displays and touch panels, in energy industry fields such as solar cells, in various electronics, such as smart windows, RFIDs, and the like.

Over the past several years, graphene has attracted considerable attention due to potential thereof for the growth of industrial technology as well as the development of basic science. In particular, a technique of manufacturing large-area graphene was recently developed, whereby application possibility thereof is increasing.

Among large-area graphene products, graphene manufactured by chemical vapor deposition (CVD), which is widely used in the industry, has a large area and high transmittance and electrical conductivity, thereby being expected to be applied to transparent electrodes.

To utilize graphene in optical and electronic devices, it is necessary to realize a diode structure which is a basic structure of a semiconductor device. In particular, if graphene is developed as a device having a hybrid structure with a silicon-based material widely used in the current industry, the ripple effect will be very great compared to other materials.

Although various diode types may be manufactured based on a metal-semiconductor or metal-oxide film-semiconductor structure, there are difficulties in applying the metal-semiconductor structure to an optical device due to low transparency of a metal.

Most graphene-silicon junction structures researched to date have demonstrated applicability as tunneling junction diodes in which the metallicity of graphene and semiconductive properties of a bulk monocrystalline silicon wafer are combined.

However, since bandgap energy of monocrystalline silicon cannot be controlled, there have been difficulties in exhibiting ideal performance of a device by combining monocrystalline silicon with graphene.

To determine the performance of a diode, an ideal factor (n) derived from a current-voltage curve of the diode is generally used. An ideal n to function as a diode is known to be 1 to 2.

However, since ideal factors of graphene-monocrystalline silicon junction tunneling diodes which have been developed to date have been reported as very high values, i.e., five or more, there are problems in exhibiting ideal diode performance.

Therefore, there is a need for an ideal and superior device that may control even electrical characteristics of graphene while controlling bandgap energy of silicon.

RELATED DOCUMENTS

Patent Document

US Patent Application Publication No. 2014/0151631 entitled "Asymmetric bottom contacted device," published on Jun. 5, 2014.

Non-Patent Documents

Chun-Chung Chen, Mehmet Aykol, Chia-Chi Chang, A. F. J. Levi, and Stephen B. Cronin, Nano Lett. 2011, 11(5), pp 1863-1867.
Ali Fattah, Saeid Khatami, Carmen C. Mayorga-Martinez, Mariana Median-Sanchez, Luis Baptista-Pires, and Arben Merkoci, small 2014, DOI: 10.1002/sm11.201400691.

SUMMARY OF THE INVENTION

Therefore, the present invention has been made in view of the above problems, and it is an object of the present invention to provide a tunneling diode using a hybrid structure including graphene-silicon quantum dots.

It is another object of the present invention to provide a tunneling diode including a graphene-silicon quantum dot hybrid structure which has improved performance by controlling the sizes of silicon quantum dots and thus controlling the energy bandgap thereof.

It is another object of the present invention to provide a tunneling diode including a graphene-silicon quantum dot hybrid structure having improved electrical characteristics by controlling a doping concentration of graphene.

It is yet another object of the present invention to provide an ideal tunneling diode including a graphene-silicon quantum dot hybrid structure which may be utilized in tunneling diode-based optoelectronic devices.

In accordance with the present invention, the above and other objects can be accomplished by the provision of a tunneling diode including a graphene-silicon quantum dot hybrid structure, the tunneling diode including: a hybrid structure composed of a silicon quantum dot layer including silicon (Si) quantum dots, each of which is formed in a thin film of a silicon oxide, and doped graphene formed on the silicon quantum dot layer; and an electrode formed upper and lower parts of the hybrid structure.

The tunneling diode may have an ideal factor of 1 to 2 according to a doping concentration of the doped the graphene and the size of the silicon quantum dots.

The silicon quantum dot layer may include silicon quantum dots formed in a $SiO_2$ thin film by sequentially laminating $SiO_2$ and SiOx thin films on a substrate and then thermally treating at 1000° C. to 1200° C. in a nitrogen atmosphere.

x may be controlled to have a value of 0.8 to 1.6 and the size of the silicon quantum dots may be controlled to correspond to a value of x.

Each of the $SiO_2$ and SiOx thin films may be sequentially laminated 23 to 25 times to a thickness unit of 2 nm each time.

A doping concentration of the doped graphene may be controlled by treating graphene formed by reacting a catalyst layer with a mixed gas containing carbon and depositing a reacted product on the catalyst layer by chemical vapor deposition (CVD).

The hybrid structure may be formed by transferring the deposited graphene onto the silicon quantum dot layer.

The doped graphene may be formed by spin coating $AuCl_3$, which has a concentration of 10 to 30 mM, on the deposited graphene and performing annealing at 90° C. to 110° C.

It is another object of the present invention to provide a method of manufacturing a tunneling diode including a graphene-silicon quantum dot hybrid structure, the method including: a step of forming a silicon quantum dot layer including silicon quantum dots, each of which is formed in a thin film of a silicon oxide, on a substrate; a step of forming a hybrid structure by forming doped graphene on the silicon quantum dot layer; and a step of forming an electrode on upper and lower parts of the hybrid structure.

The step of forming the silicon quantum dot layer may include a step of sequentially laminating $SiO_2$ and $SiOx$ thin films on a substrate and then thermally treating at 1000° C. to 1200° C. in a nitrogen atmosphere to form the silicon quantum dots in the $SiO_2$ thin film. Here, x may be controlled to have a value of 0.8 to 1.6 and the sizes of the silicon quantum dots may be controlled to correspond to a value of x.

The step of forming the hybrid structure may include a step of forming graphene on a catalyst layer by reacting the catalyst layer with a mixed gas containing carbon and thus performing deposition by chemical vapor deposition (CVD); a step of transferring the formed graphene on the silicon quantum dot layer; and a step of doping graphene by spin-coating $AuCl_3$ at a concentration of 10 to 30 mM, and performing annealing at 90° C. to 110° C.

BRIEF DESCRIPTION OF THE DRAWINGS

The above and other objects, features and other advantages of the present invention will be more clearly understood from the following detailed description taken in conjunction with the accompanying drawings, in which:

FIG. 9 illustrates Raman spectra of a tunneling diode including a graphene-silicon quantum dot hybrid structure according to an embodiment of the present disclosure at different doping concentrations of graphene, and FIG. 10 illustrates the highest peaks of 2D and G peak according to the doping concentration of graphene;

DETAILED DESCRIPTION OF THE INVENTION

Figure 1:
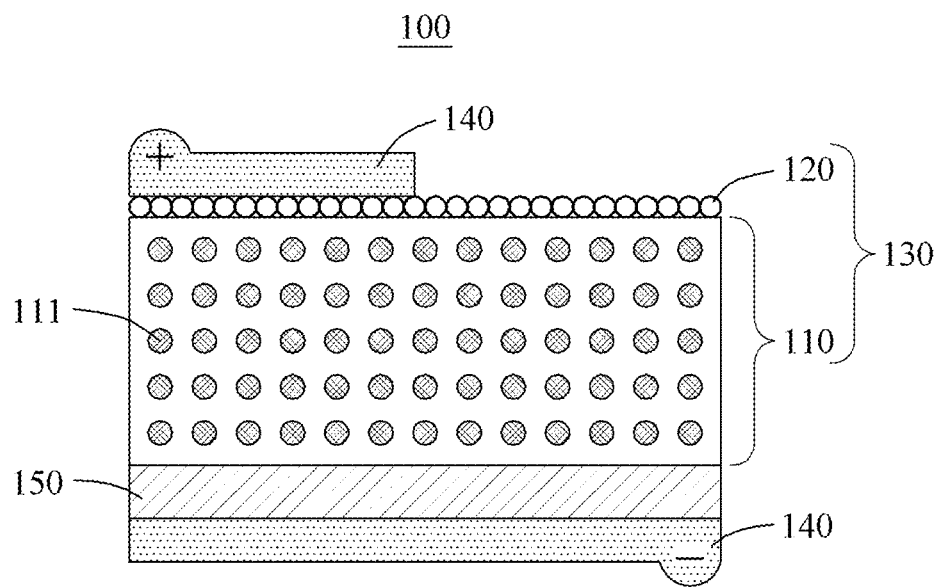
FIG. 1 illustrates a tunneling diode including a graphene-silicon quantum dot hybrid according to an embodiment of the present disclosure.

Hereinafter, the embodiments of the present invention are described with reference to the accompanying drawings and the description thereof but are not limited thereto.

It will be understood that when an element or layer is referred to as being "on" another element or layer, it can be directly on the other element or layer or intervening elements or layers may be present therebetween. In contrast, when an element or layer is referred to as being "directly on" another element or layer, there are no intervening elements or layers present.

Spatially-relative terms such as "below", "beneath", "lower", "above", or "upper" may be used herein to describe one element's relationship to another element as illustrated in the Figures. It will be understood that spatially-relative terms are intended to encompass different orientations of the device in addition to the orientation depicted in the Figures. For example, if the device in one of the figures is turned over, elements described as "below" or "beneath" other elements would then be oriented "above" the other elements. The exemplary terms "below" or "beneath" can, therefore, encompass both an orientation of above and below. Since the device may be oriented in another direction, the spatially-relative terms may be interpreted in accordance with the orientation of the device.

The terminology used in the present disclosure serves the purpose of describing particular embodiments only and is not intended to limit the disclosure. As used in the disclosure and the appended claims, the singular forms "a", "an" and "the" are intended to include the plural forms as well, unless context clearly indicates otherwise. It will be further understood that the terms "includes" and/or "including," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Meanwhile, in the following description of the present invention, a detailed description of known functions and configurations incorporated herein will be omitted when it may make the subject matter of the present invention unclear. The terms used in the specification are defined in consideration of functions used in the present invention, and can be changed according to the intent or conventionally used methods of clients, operators, and users. Accordingly, definitions of the terms should be understood on the basis of the entire description of the present specification.

FIG. 1 illustrates a tunneling diode including a graphene-silicon quantum dot hybrid according to an embodiment of the present disclosure.

Referring to FIG. 1, a tunneling diode 100 including a graphene-silicon quantum dot hybrid structure according to an embodiment of the present disclosure includes a hybrid structure 130, which is based on doped graphene 130 and silicon quantum dots 111, and electrodes 140, which are formed on upper and lower parts of the hybrid structure 130.

The tunneling diode 100 including the graphene-silicon quantum dot hybrid of the present disclosure has an ideal factor of 1 to 2 depending upon a doping concentration of the doped graphene 120 and the sizes of the silicon quantum dots 111.

The hybrid structure 130 includes a silicon quantum dot layer 110 including the silicon quantum dots 111, each of which is formed inside a thin film of silicon oxide; and doped graphene 120 formed on the silicon quantum dot layer 110.

A doping concentration of the doped graphene 120 may be controlled by treating graphene formed by reacting a catalyst layer with a mixed gas containing carbon and depositing a reacted product on the catalyst layer by chemical vapor deposition (CVD).

For example, the doping concentration of the doped graphene 120 may be controlled by spin coating $AuCl_3$ with a concentration of 10 to 30 mM on the deposited graphene, followed by annealing at 90° C. to 110° C.

According to another embodiment of the present disclosure, the hybrid structure 130 may be formed by transferring the deposited graphene onto the silicon quantum dot layer 110.

The silicon quantum dot layer 110 may include the silicon quantum dots 111 formed in a $SiO_2$ thin film by sequentially stacking $SiO_2$ and SiOx thin films on the substrate 150 and then thermally treating at 1000° C. to 1200° C. in a nitrogen atmosphere. x may be controlled to have a value of 0.8 to 1.6 and the sizes of the silicon quantum dots 111 may be controlled to correspond to a value of x.

In addition, the $SiO_2$ and SiOx thin films may be sequentially laminated 23 to 25 times to a thickness of 2 mm each time, respectively.

FIGS. 2A to 2E illustrate a process of manufacturing a tunneling diode including the graphene-silicon quantum dot hybrid structure according to an embodiment of the present disclosure.

<Manufacture of Silicon Quantum Dots>

As illustrated in FIG. 1, the tunneling diode including a graphene-silicon quantum dot hybrid structure includes the silicon quantum dot layer 110 including the silicon quantum dots 111, each of which is formed inside a thin film of a silicon oxide.

Figure 2A:
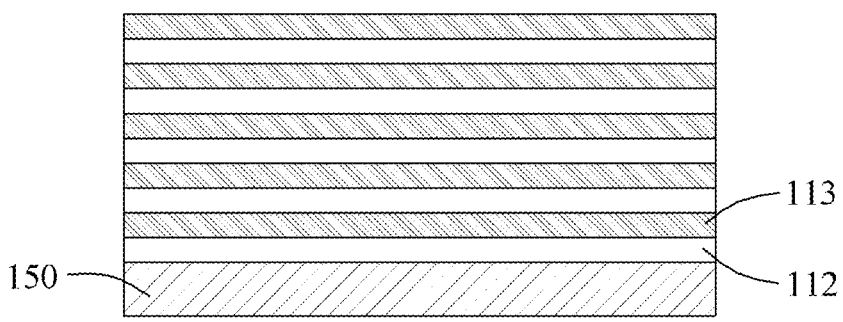
FIGS. 2A to 2E illustrate a process of manufacturing a tunneling diode including the graphene-silicon quantum dot hybrid structure according to an embodiment of the present disclosure.
Figure 2B:
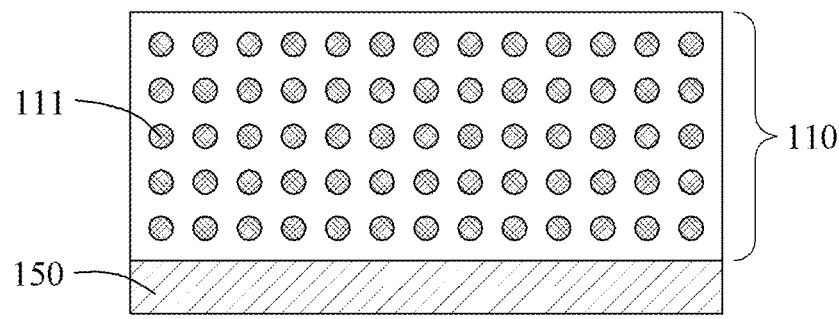

Referring to FIGS. 2A and 2B, a method of manufacturing the tunneling diode including a graphene-silicon quantum dot hybrid structure according to an embodiment of the present disclosure may include a process of forming the silicon quantum dot layer 110 by sequentially stacking $SiO_2$ and SiOx thin films 112 and 113 on the substrate 150 and then thermally treating at 1000° C. to 1200° C. in a nitrogen atmosphere, thereby forming the silicon quantum dots 111 inside the $SiO_2$ thin film 112.

For example, the silicon quantum dot layer 110 may be formed by alternately depositing the $SiO_2$ thin film 112 to a thickness of 2 nm and the SiOx thin film 113 to a thickness of 2 nm at a predetermined cycle on the substrate 150 by ion beam sputtering deposition, followed by rapidly, thermally treating for 20 minutes at 1000° C. to 1200° C. in a nitrogen atmosphere 20. In this case, the $SiO_2$ thin film 112 having a thickness of 2 nm and the SiOx thin film 113 having a thickness of 2 nm may be deposited up to a total thickness of 100 nm through 25 cycles. Here, x is controlled to have a value of 0.8 to 1.6 and the sizes of the silicon quantum dots may be adjusted to correspond to a value of x.

In addition, a value of x may be adjusted by means of an X-ray spectrometer (XPS). Hereinafter, the properties of the manufactured silicon quantum dots are described with reference to FIGS. 3 to 6.

Figure 3:
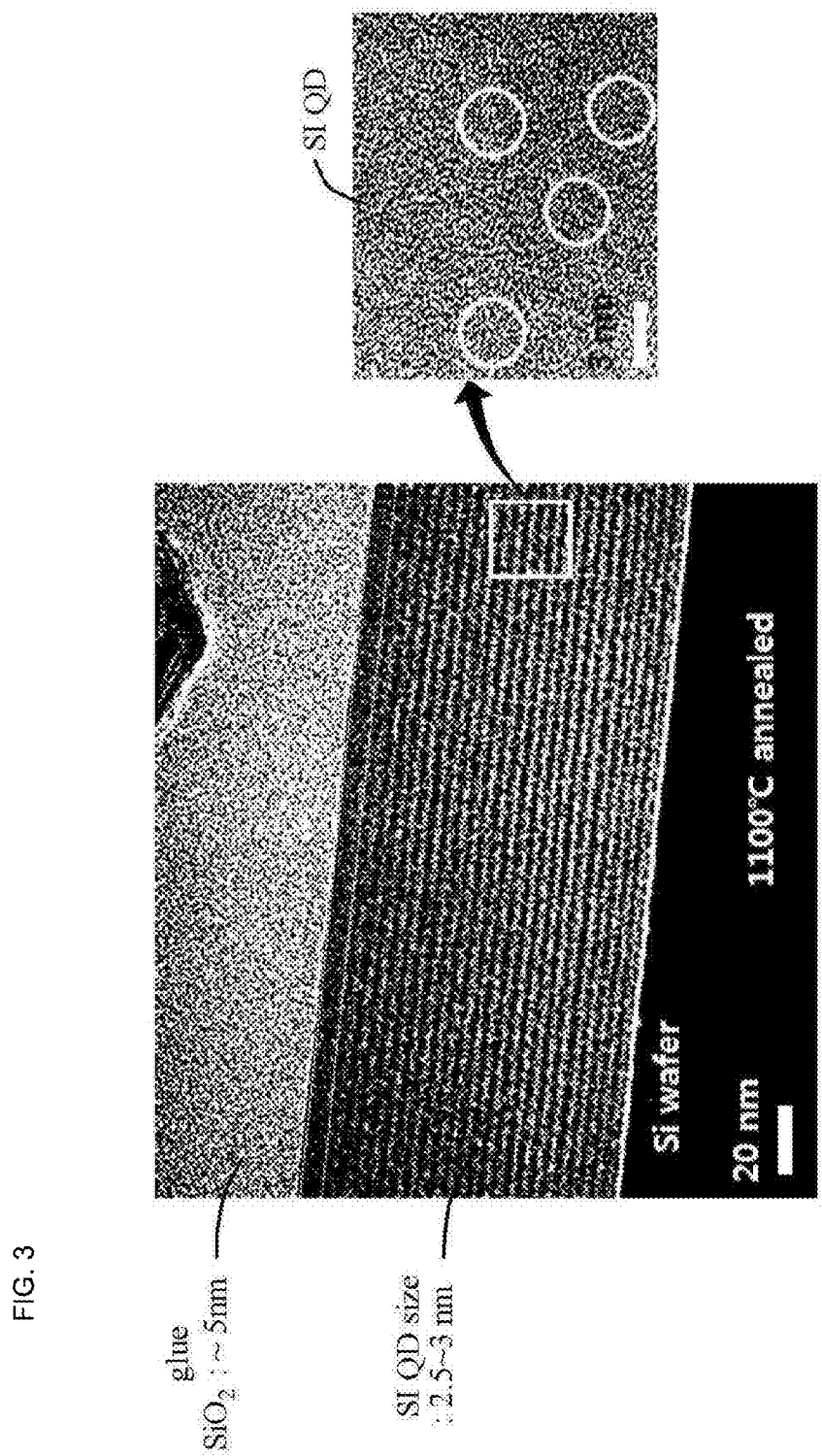
FIG. 3 illustrates a transmission electron microscope (TEM) image of silicon quantum dots included in a tunneling diode including a graphene-silicon quantum dot hybrid structure according to an embodiment of the present disclosure.

FIG. 3 illustrates a transmission electron microscope (TEM) image of silicon quantum dots included in a tunneling diode including a graphene-silicon quantum dot hybrid structure according to an embodiment of the present disclosure.

More particularly, FIG. 3 illustrates a transmission electron microscope image of a cross section of the silicon quantum dot layer 110 formed by alternately depositing 2 nm of the $SiO_2$ thin film 112 and 2 nm of the SiOx thin film 113 on the substrate 150 25 times by ion beam sputtering deposition and rapidly heat treating for 20 minutes at 1000° C. to 1200° C. in a nitrogen atmosphere, as described in FIG. 2. Here, x is controlled to have a value of 1.0.

Referring to FIG. 3, it can be confirmed that silicon quantum dots having sizes of 2.5 to 3.0 nm are uniformly formed in a silicon oxide ($SiO_2$) thin film.

Figure 4:
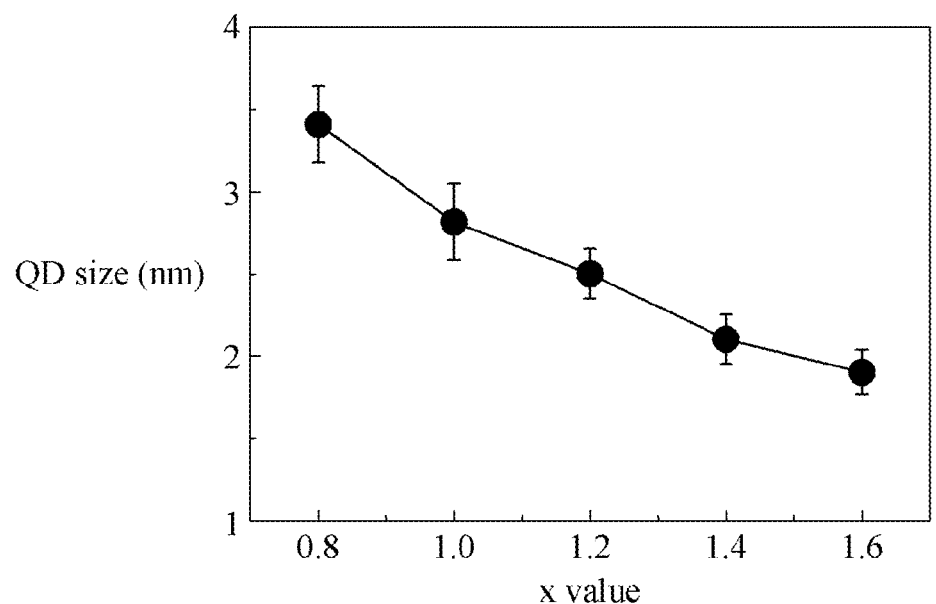
FIG. 4 illustrates average sizes, which are dependent upon an x value of a SiOx thin film, of silicon quantum dots included in a tunneling diode according to an embodiment of the present disclosure.

FIG. 4 illustrates average sizes, which are dependent upon an x value of a SiOx thin film, of silicon quantum dots included in a tunneling diode according to an embodiment of the present disclosure.

Referring to FIG. 4, it can be confirmed that an average size of silicon quantum dots decreases from 3.4 nm to 1.9 nm with increasing x value from 0.8 to 1.6.

Figure 5A:
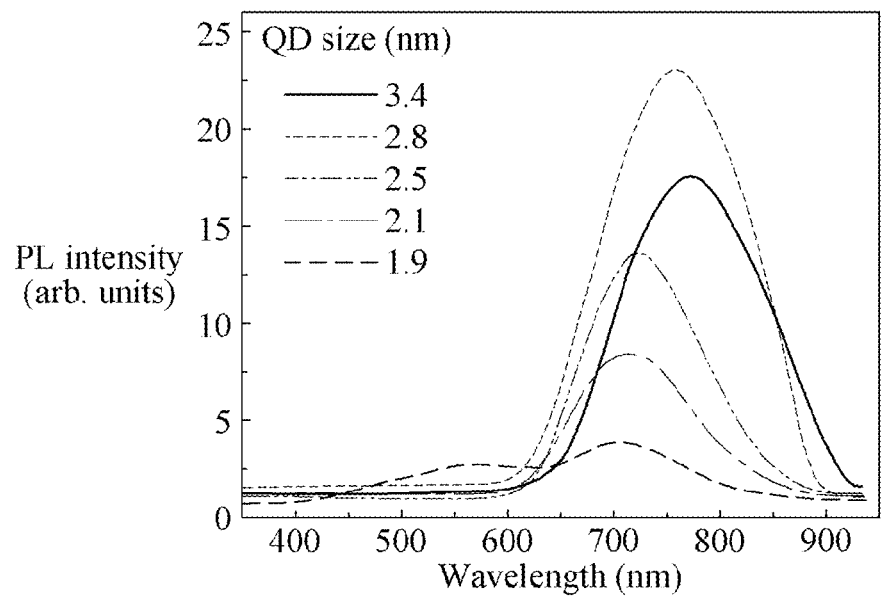
FIG. 5A illustrates photoluminescence (PL) spectra dependent upon wavelengths at different sizes of silicon quantum dots with respect to silicon quantum dots included in a tunneling diode according to an embodiment of the present disclosure.
Figure 5B:
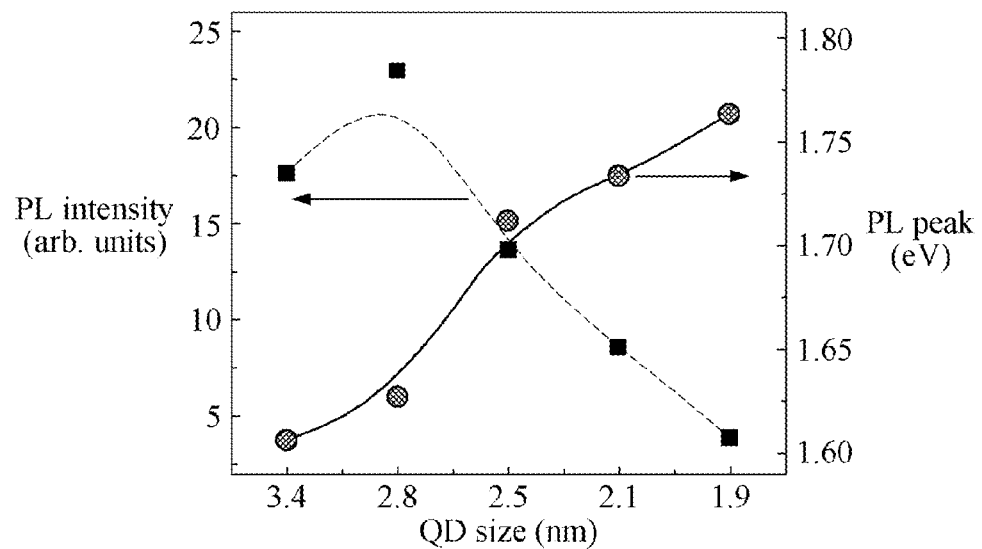
FIG. 5B illustrates changes in the photoluminescence peaks of FIG. 5A dependent upon the sizes of silicon quantum dots.

FIG. 5A illustrates photoluminescence (PL) spectra dependent upon wavelengths at different sizes of silicon quantum dots with respect to silicon quantum dots included in a tunneling diode according to an embodiment of the present disclosure, and FIG. 5B illustrates changes in the photoluminescence peaks of FIG. 5A dependent upon the sizes of silicon quantum dots.

Referring to FIG. 5A, it can be confirmed that, with respect to all silicon quantum dots having sizes of 1.9 nm, 2.1 nm, 2.5 nm, 2.8 nm, and 3.4 nm, photoluminescence peaks are observed from the near infrared region to the visible light region.

In addition, referring to FIG. 5B, it can be confirmed that, according to decrease in the sizes of silicon quantum dots from 3.4 nm to 1.9 nm, energy of photoluminescence peaks is blue-shifted from 1.60 eV to 1.76 eV due to the quantum confinement effect (QCE) of the silicon quantum dots.

On the other hand, it can be confirmed from FIG. 5B that the intensity of photoluminescence is highest when the size of the silicon quantum dots is 2.8 nm. This result shows that the 2.8 nm silicon quantum dots according to an embodiment of the present disclosure have high density and the best crystallinity.

Figure 2C:
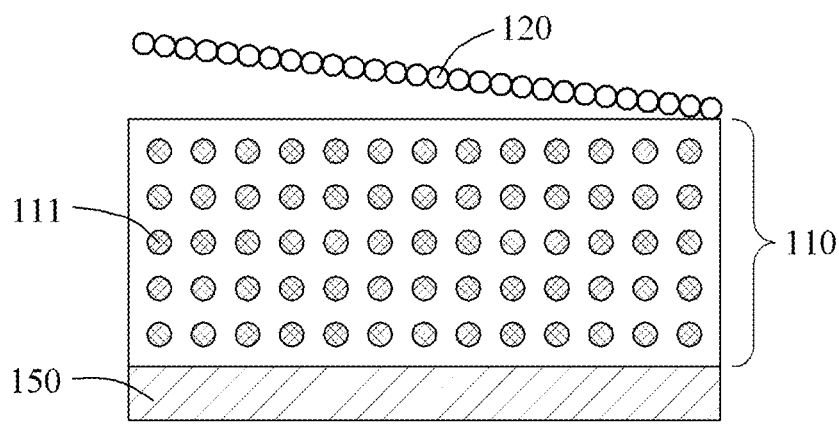
Figure 2D:
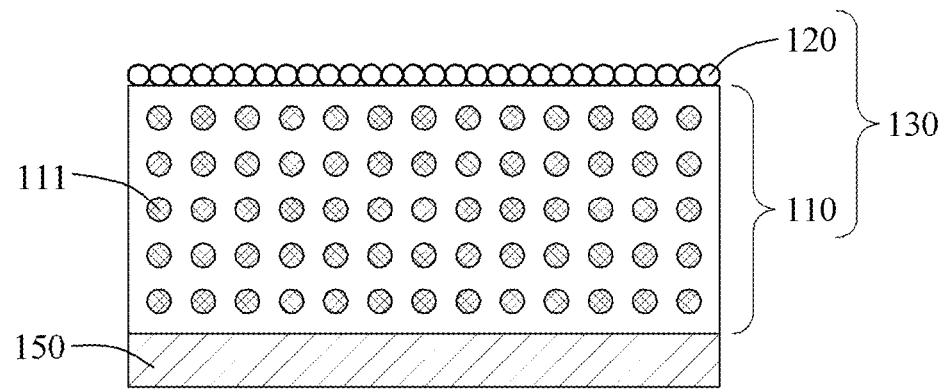

Referring to FIGS. 2C and 2D, a method of manufacturing the tunneling diode including a graphene-silicon quantum dot hybrid structure according to an embodiment of the present disclosure includes a process of manufacturing a single-layer graphene 120 by chemical vapor deposition and then transferring the manufactured single-layer graphene 120 onto a silicon quantum dot layer 120.

The hybrid structure 130 includes the silicon quantum dot layer 110 including the silicon quantum dots 111, each of which is formed inside a thin film of a silicon oxide, and the doped graphene 120 formed on the silicon quantum dot layer 110.

The doped graphene 120 may be deposited on the catalyst layer by reacting a catalyst layer with carbon-containing gas using chemical vapor deposition (CVD) and a doping concentration thereof may be adjusted. A process of manufacturing the doped graphene will be described in more detail.

<Manufacture of Doped Graphene-Silicon Quantum Dot Hybrid Structure>

A process of manufacturing single-layer graphene by chemical vapor deposition is as follows. Copper (or nickel) utilized as a catalyst layer is deposited on a substrate, followed by reaction with a mixed gas including methane and hydrogen gases at high temperature such that an appropriate amount of carbon is dissolved in or adsorbed onto the catalyst layer. Subsequently, cooling is performed, whereby carbon atoms included in the catalyst layer are crystallized and thus a graphene crystal structure is formed on a metal.

Subsequently, the catalyst layer is separated from the synthesized graphene thin film and thus removed from a substrate, thereby manufacturing a single-layer graphene.

In an example of the present disclosure, a 70 μm copper foil was inserted into a quartz tube, the flow rate of methane gas was changed from 10 sccm to 30 sccm, the flow rate of hydrogen gas was fixed to 10 sccm, and a process pressure was fixed to 3 mTorr, thereby synthesizing graphene.

Subsequently, PMMA, which was prepared by mixing poly(methyl methacrylate) with benzene, was spin-coated on the synthesized graphene. Here, the PMMA coating was performed such that, when the copper foil was removed using an ammonium persulfate solution, PMMA grasped and fixed graphene.

Subsequently, after removing the copper foil from the ammonium persulfate solution, an ammonium persulfate solution remaining on the graphene was washed using DI water. The washed graphene was transferred onto a 300 nm $SiO_2$/Si substrate.

Next, after transfer of the graphene onto the $SiO_2$/Si substrate, thermal treatment was performed to increase binding strength between the substrate and the graphene. Subsequently, the PMMA present on the graphene was removed using acetone, and rapid heat treatment was performed by means of a rapid heat treatment machine so as to remove a PMMA residue remaining on a graphene surface. As a result, a single-layer graphene was finally manufactured.

Referring again to FIG. 2C, the method of manufacturing the tunneling diode including a graphene-silicon quantum dot hybrid structure according to an embodiment of the present disclosure includes, after manufacture of the single-layer graphene 120 by chemical vapor deposition, a process of transferring the manufactured single-layer graphene 120 onto the silicon quantum dot layer 120.

Referring again to FIG. 2D, the doped graphene-silicon quantum dot hybrid structure 130 may be formed by adjusting a doping concentration of the graphene 120 transferred onto the silicon quantum dot layer 120.

In particular, the doped graphene 120 may be manufactured by spin coating a p-type or n-type doping solution on graphene and performing annealing. For example, the doped graphene 120 is formed by spin coating $AuCl_3$ having a concentration of 10 mM to 30 mM on graphene, which has been formed by deposition, and annealing the same at 90° C. to 110° C. for 10 minutes. A doping concentration of the doped graphene 120 may be controlled by adjusting the concentration of $AuCl_3$.

<Manufacture of Tunneling Diode Having Graphene-Silicon Quantum Dot Hybrid Structure>

Figure 2E:
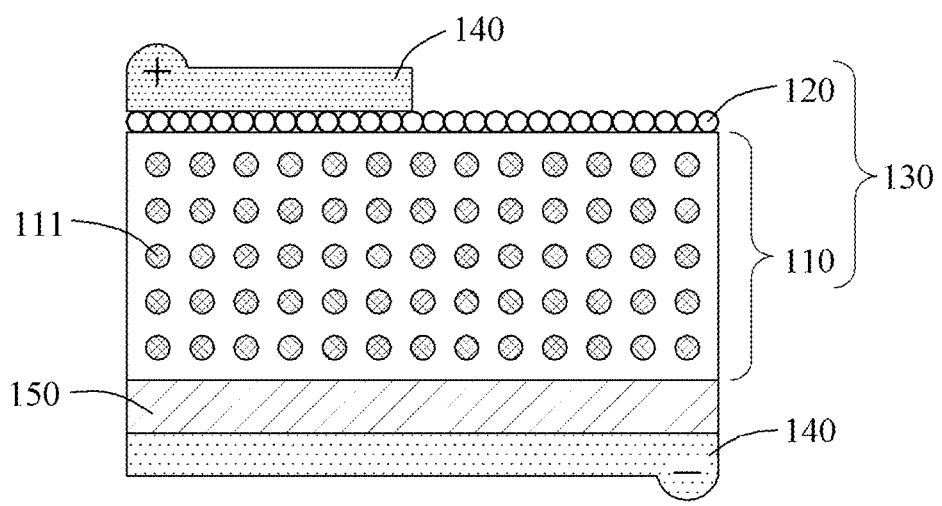

Referring to FIG. 2E, the method of manufacturing the tunneling diode including a graphene-silicon quantum dot hybrid structure according to an embodiment of the present disclosure includes a process of forming an electrode on upper and lower parts of the doped graphene-silicon quantum dot hybrid structure 130 formed on the substrate according to the process of FIGS. 2A to 2D.

For example, the method of manufacturing the tunneling diode including a graphene-silicon quantum dot hybrid structure according to an embodiment of the present disclosure may include a process of sequentially depositing a chrome/gold (Cr/Au) metal on upper and lower parts of the doped graphene-silicon quantum dot hybrid structure 130 and thus forming an electrode on each thereof.

Figure 6:
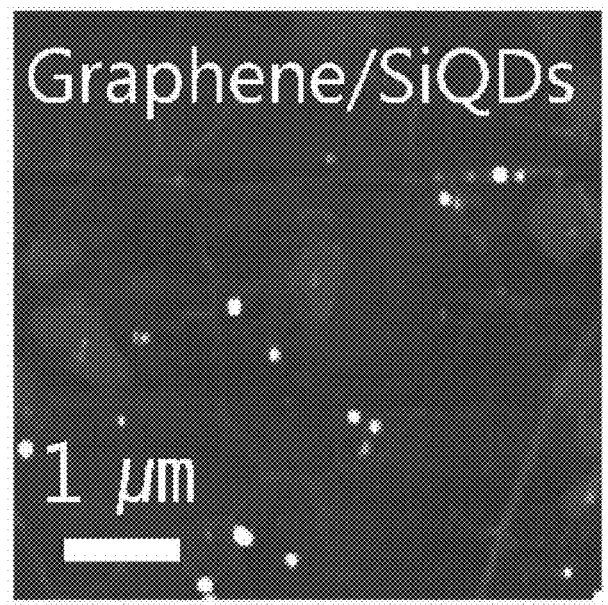
FIG. 6 illustrates an atomic force microscopy (AFM) image of a surface formed after transferring graphene onto a silicon quantum dot layer with respect to a tunneling diode including a graphene-silicon quantum dot hybrid structure according to an embodiment of the present disclosure.

FIG. 6 illustrates an atomic force microscopy (AFM) image of a surface formed after transferring graphene onto a silicon quantum dot layer with respect to a tunneling diode including a graphene-silicon quantum dot hybrid structure according to an embodiment of the present disclosure.

Referring to FIG. 6, it can be confirmed that graphene is uniformly transferred onto a silicon quantum dot layer. This result occurs because an oxide film of the silicon quantum dot layer is hydrophilic and thus, when graphene is transferred onto the silicon quantum dot layer, the graphene is stable and uniformed formed.

Figure 7:
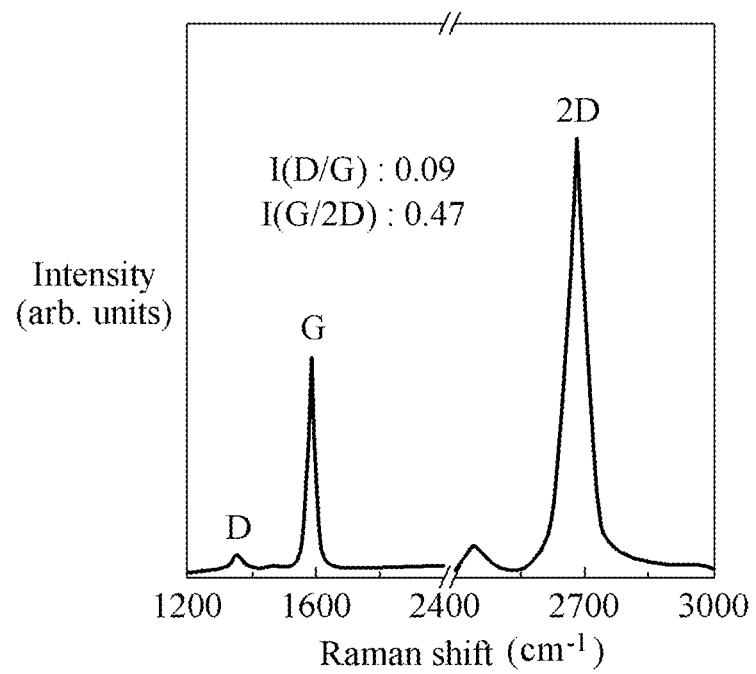
FIG. 7 illustrates a Raman spectrum result of graphene transferred onto a silicon quantum dot layer with respect to a tunneling diode including a graphene-silicon quantum dot hybrid structure of the present disclosure.

FIG. 7 illustrates a Raman spectrum result of graphene transferred onto a silicon quantum dot layer with respect to a tunneling diode including a graphene-silicon quantum dot hybrid structure of the present disclosure.

Since two-dimensional materials, such as graphene, have strong electron-phonon coupling, various Raman peaks are observed. Referring to FIG. 7, it can be confirmed that, with respect to single-layer graphene according to an example of the present disclosure, a G peak near 1580 to 1590 cm$^{-1}$ and a 2D peak near 2700 cm$^{-1}$, as Raman peaks related to phonons, are observed.

In general, a Raman intensity ratio (I(G/2D)) of a G peak to a 2D peak is related to the thickness (the number of layers) of graphene, and a Raman intensity ratio (I(D/G)) of a D peak to a G peak is highly related to crystallinity (or the amount of defect) of graphene.

As shown in FIG. 7, it can be confirmed that a Raman intensity ratio (I(G/2D)) with respect to a G peak and a 2D peak is 0.47 and a Raman intensity ratio with respect to a D peak and a G peak is 0.09. This result shows that the graphene which has been transferred on the silicon quantum dot layer according to an embodiment of the present disclosure has high quality.

Figure 8:
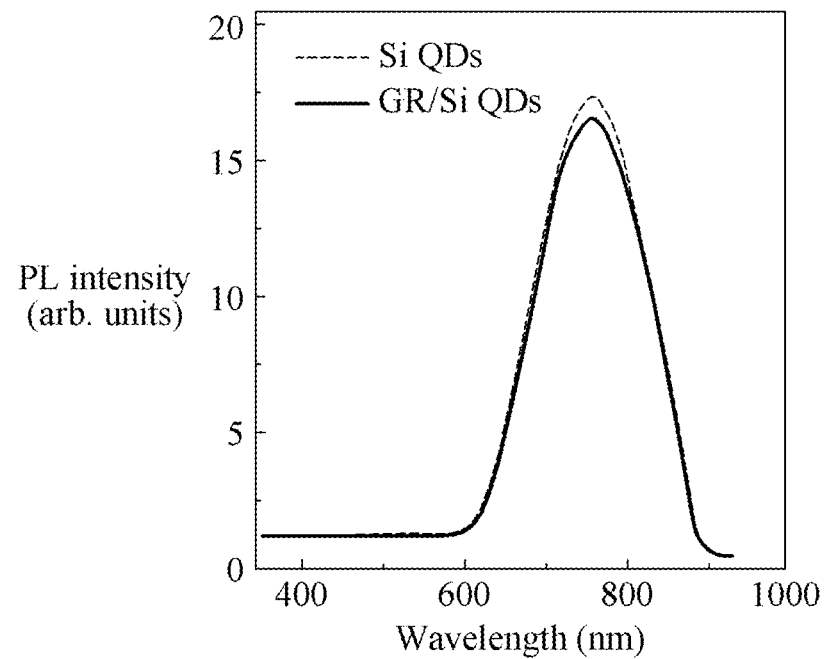
FIG. 8 illustrates photoluminescence (PL) spectra before and after transferring graphene onto a silicon quantum dot layer with respect to a tunneling diode including a graphene-silicon quantum dot hybrid structure according to an embodiment of the present disclosure.

FIG. 8 illustrates photoluminescence (PL) spectra before and after transferring graphene onto a silicon quantum dot layer with respect to a tunneling diode including a graphene-silicon quantum dot hybrid structure according to an embodiment of the present disclosure.

Referring to FIG. 8, it can be confirmed that the intensity of photoluminescence is hardly changed before and after transfer of the graphene. This result indicates that, although the graphene is transferred onto the silicon quantum dot layer, an optical absorption amount and a light emission amount are not changed and the transmittance of graphene is very high.

FIG. 9 illustrates Raman spectra of a tunneling diode including a graphene-silicon quantum dot hybrid structure according to an embodiment of the present disclosure at different doping concentrations of graphene, and FIG. 10 illustrates the highest peaks of 2D and G peak according to the doping concentration of graphene.

Referring to FIG. 9, it can be confirmed that D, G, and 2D peaks are generated at different doping concentrations of graphene. Referring to FIG. 10, it can be confirmed that, with increasing doping concentration, the highest points of the 2D peak and the G peak are blue-shifted in a high wavenumber direction. Such Raman peak change indicates that the structures of electrons are changed by a doping concentration of AuCl$_3$ of graphene. In particular, this result indicates that the structures of electrons are gradually changed into one direction, i.e., into a direction in which Raman scattering energy increases.

Figure 11:
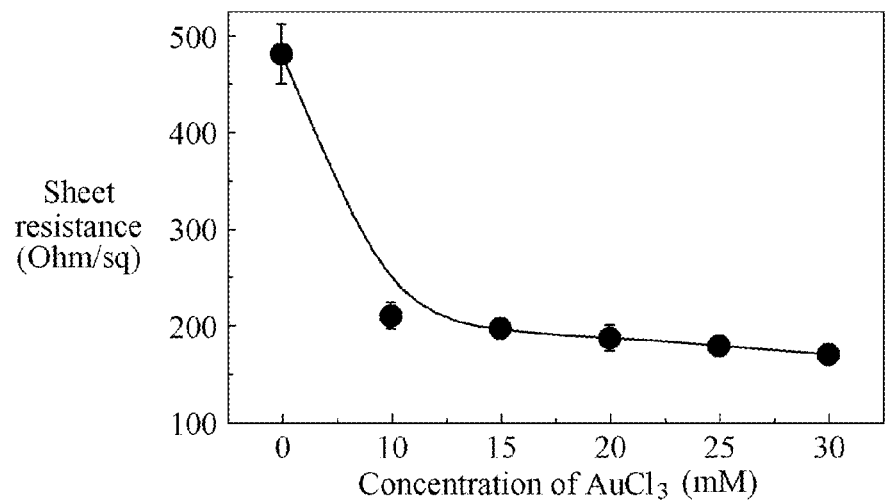
FIG. 11 illustrates sheet resistance of graphene according to the doping concentration of graphene, with respect to a tunneling diode including a graphene-silicon quantum dot hybrid structure according to an embodiment of the present disclosure.

FIG. 11 illustrates sheet resistance of graphene according to the doping concentration of graphene, with respect to a tunneling diode including a graphene-silicon quantum dot hybrid structure according to an embodiment of the present disclosure.

Referring to FIG. 11, it can be confirmed that the sheet resistance of graphene at an initial state is observed as 450 to 500 ohm/sq, and the sheet resistance of doped graphene is monotonously decreased up to 170 ohm/sq as a doping concentration decreases to 30 mM.

Figure 12:
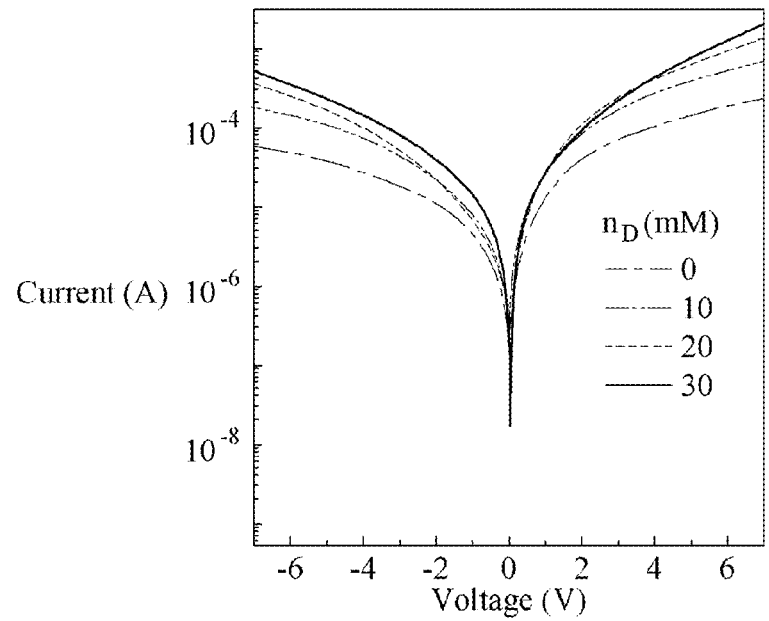
FIG. 12 illustrates current-voltage curves according to the doping concentration of graphene, with respect to a tunneling diode including a graphene-silicon quantum dot hybrid structure according to an embodiment of the present disclosure.
Figure 13A:
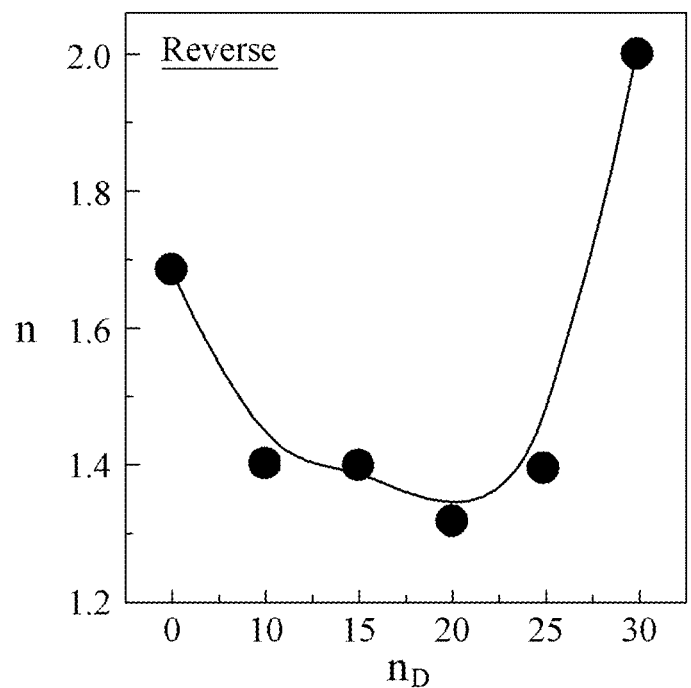
FIG. 13A illustrates an ideal factor of the tunneling diode of FIG. 12 when used in the reverse direction.
Figure 13B:
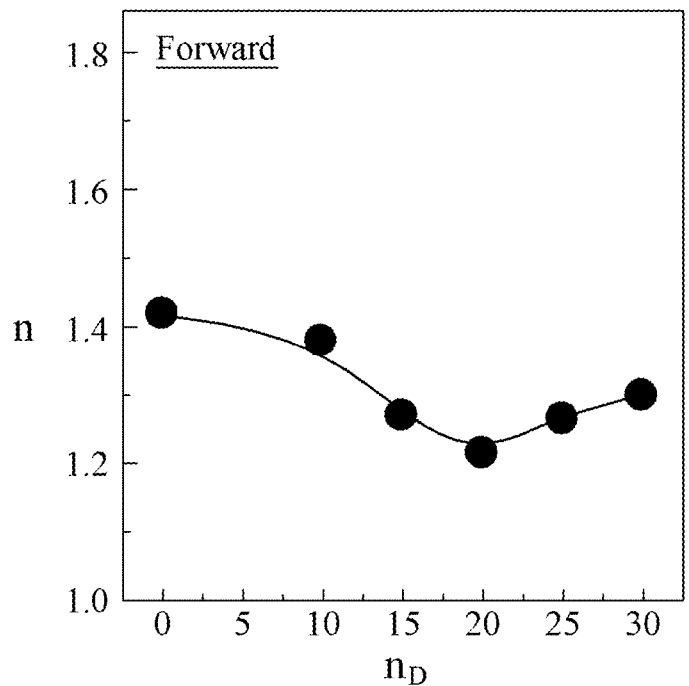
FIG. 13B illustrates an ideal factor of the tunneling diode of FIG. 12 when used in the forward direction.

FIG. 12 illustrates current-voltage curves according to the doping concentration of graphene, with respect to a tunneling diode including a graphene-silicon quantum dot hybrid structure according to an embodiment of the present disclosure, FIG. 13A illustrates an ideal factor of the tunneling diode of FIG. 12 when used in the reverse direction, and FIG. 13B illustrates an ideal factor of the tunneling diode of FIG. 12 when used in the forward direction.

An ideal factor (n) of an ideal diode is 1.0 to 2.0. As the ideal factor approaches 1, the diode becomes more ideal, which means less electric charge trap sites or states. In addition, as the ideal factor approaches 1, a recombination rate between electrons and holes is low.

Referring to FIGS. 12, 13A, and 13B, the tunneling diode including the graphene-silicon quantum dot hybrid structure has 2.8 nm silicon quantum dots. Particularly, when a doping concentration of AuCl$_3$ of graphene is 0 to 30 mM, an ideal diode characteristic, i.e., an ideal factor (n) between 1.0 and 2.0 at forward and reverse directions, is exhibited.

In addition, it can be confirmed that, when a doping concentration of AuCl$_3$ of graphene is 20 mM, an ideal factor of the tunneling diode including the graphene-silicon quantum dot hybrid structure according to an embodiment of the present disclosure is closest to 1.0 at both forward and reverse directions. Accordingly, it can be confirmed that performance of the tunneling diode is optimal.

Figure 14:
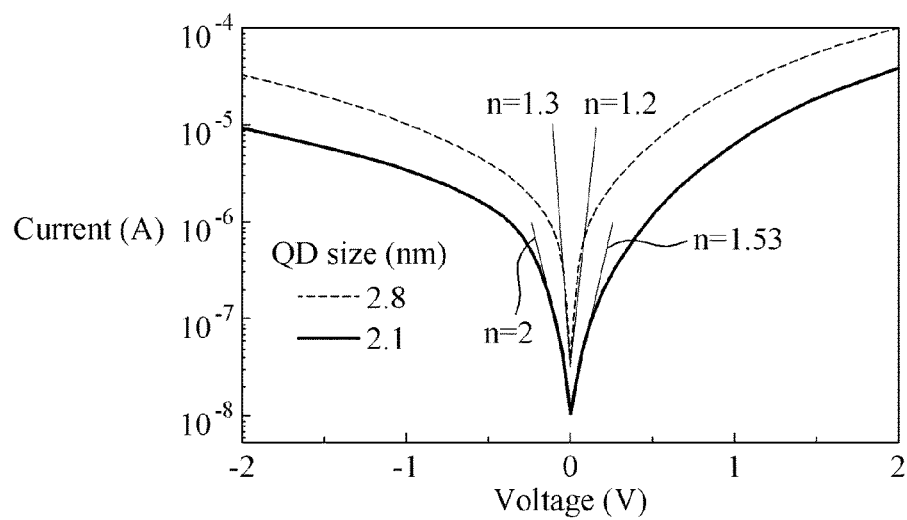
FIG. 14 illustrates current-voltage curves according to the sizes of silicon quantum dots, with respect to a tunneling diode including a graphene-silicon quantum dot hybrid structure according to an embodiment of the present disclosure.
Figure 15A:
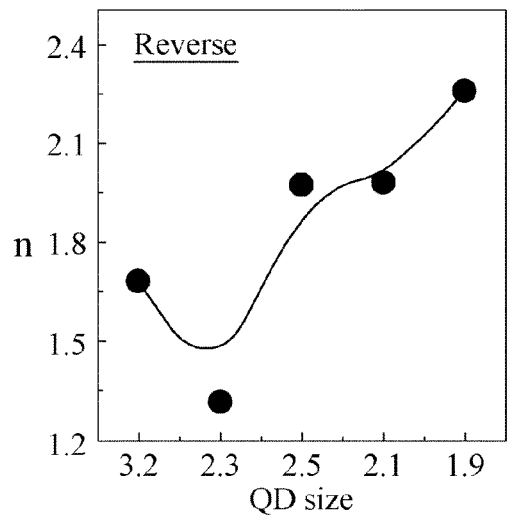
FIG. 15A illustrates an ideal factor of the tunneling diode of FIG. 14 when used in the reverse direction.
Figure 15B:
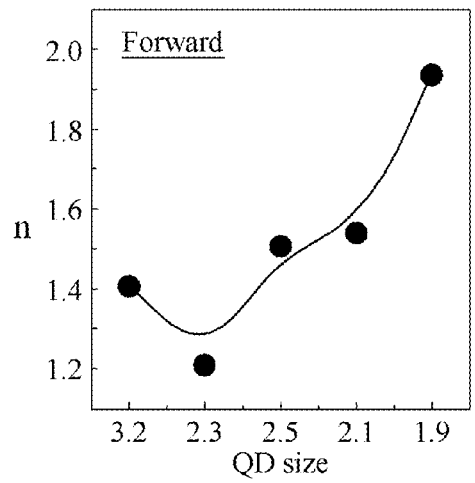
FIG. 15B illustrates an ideal factor of the tunneling diode of FIG. 14 when used in the forward direction.

FIG. 14 illustrates current-voltage curves according to the sizes of silicon quantum dots, with respect to a tunneling diode including a graphene-silicon quantum dot hybrid structure according to an embodiment of the present disclosure, FIG. 15A illustrates an ideal factor of the tunneling diode of FIG. 14 when used in the reverse direction, and FIG. 15B illustrates an ideal factor of the tunneling diode of FIG. 14 when used in the forward direction.

A doping concentration of AuCl$_3$ of graphene in a tunneling diode including the graphene-silicon quantum dot hybrid structure of FIGS. 14, 15A, and 15B is 20 mM according to results shown in FIGS. 13A and 13B. From the drawings, it can be confirmed that, although doping concentration of AuCl$_3$ of graphene is the same, an ideal factor of the tunneling diode might not constant depending upon the sizes of silicon quantum dots.

It can be confirmed that, when the size of the silicon quantum dots is 2.8 nm, an ideal factor becomes close to 1. That is, performance of the tunneling diode including the graphene-silicon quantum dot hybrid structure, i.e., a graphene/silicon junction diode, according to an embodiment of the present disclosure is optimized when a doping concentration of AuCl$_3$ is 20 mM and the size of silicon quantum dots is 2.8 nm.

Figure 16:
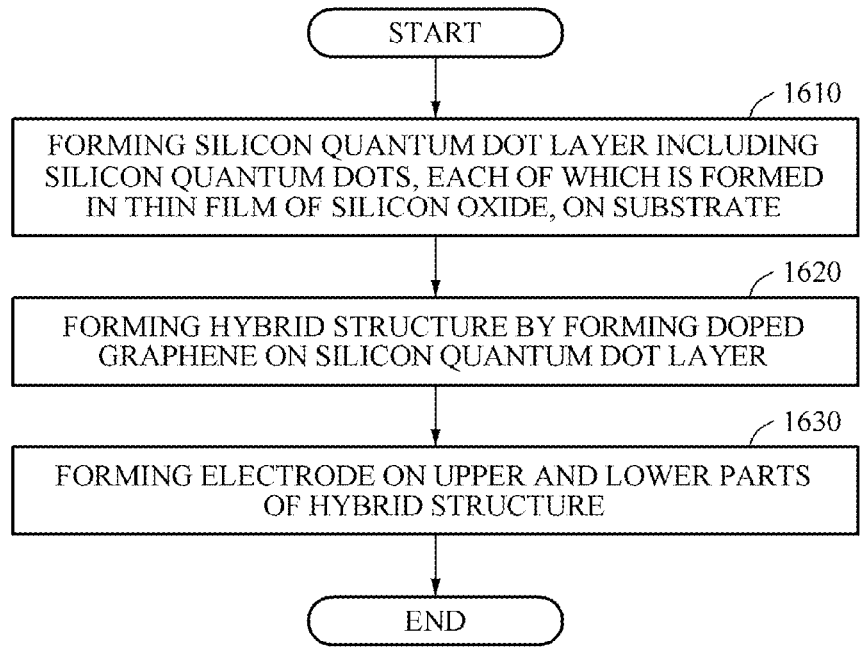
FIG. 16 is flowchart illustrating a method of manufacturing the tunneling diode including the graphene-silicon quantum dot hybrid structure according to an embodiment of the present disclosure.

FIG. 16 is flowchart illustrating a method of manufacturing the tunneling diode including the graphene-silicon quantum dot hybrid structure according to an embodiment of the present disclosure.

Referring to FIG. 16, in step 1610, a silicon quantum dot layer including silicon quantum dots, each of which is formed in a thin film of a silicon oxide, is formed on a substrate.

In step 1610, SiO$_2$ and SiOx thin films are sequentially laminated on a substrate and then thermal treatment is performed at 1000° C. to 1200° C. in a nitrogen atmosphere, whereby the silicon quantum dots are formed in the SiO$_2$ thin film. Here, x may be controlled to have a value of 0.8 to 1.6 and the sizes of the silicon quantum dots may be controlled to correspond to a value of x.

At step 1620, doped graphene is formed on the silicon quantum dot layer, thereby forming a hybrid structure.

Step 1620 may include a step of forming graphene on a catalyst layer by reacting the catalyst layer with a mixed gas containing carbon and thus performing chemical vapor deposition (CVD).

In addition, step 1620 may include a step of doping graphene by transferring the formed graphene onto the silicon quantum dot layer, spin-coating AuCl₃ at a concentration of 10 to 30 mM, and performing annealing at 90° C. to 110° C.

In step 1630, an electrode is formed on upper and lower parts of the hybrid structure.

As apparent from the above description, performance of the tunneling diode including the graphene-silicon quantum dot hybrid structure may be improved by controlling the sizes of silicon quantum dots thereof and thus controlling an energy bandgap, according to the present disclosure.

In addition, electrical characteristics of the tunneling diode including the graphene-silicon quantum dot hybrid structure may be increased by controlling a doping concentration of graphene, according to the present disclosure.

Further, an ideal tunneling diode, i.e., the tunneling diode including the graphene-silicon quantum dot hybrid structure, which may be utilized in tunneling diode-based optoelectronic devices, may be provided according to the present disclosure.

Although exemplary embodiments of the present invention have been disclosed for illustrative purposes, those skilled in the art will appreciate that various modifications, additions and substitutions are possible, without departing from the scope and spirit of the invention as disclosed in the accompanying claims. For example, proper result may be achieved even if the techniques described above are implemented in an order different from that for the disclosed method, and/or disclosed constituents such as a system, structure, device and circuit are coupled to or combined with each other in a form different from that for the disclosed method or replaced by other constituents or equivalents.

It should be understood, however, that there is no intent to limit the invention to the embodiments disclosed, rather, the invention is to cover all modifications, equivalents, and alternatives falling within the spirit and scope of the invention as defined by the claims.

What is claimed is:

1. A method of manufacturing a photodiode comprising a graphene-silicon quantum dot hybrid structure, the method comprising:

forming a silicon quantum dot layer comprising silicon quantum dots, each of which is formed in a thin film of a silicon oxide, on a substrate;

forming a hybrid structure by forming doped graphene on the silicon quantum dot layer; and forming an electrode on upper and lower parts of the hybrid structure, wherein the forming of the silicon quantum dot layer comprises sequentially laminating $SiO_2$ and $SiO_x$ thin films on the substrate and then thermally treating the laminated $SiO_2$ and $SiO_x$ thin films at 1000° C. to 1200° C. in a nitrogen atmosphere to form the silicon quantum dots in the $SiO_2$ thin film, and wherein x is controlled to have a value of 0.8 to 1.6 and sizes of the silicon quantum dots are controlled to correspond to a value of x.

2. The method according to claim 1, wherein the forming of the hybrid structure comprises forming graphene on a catalyst layer by reacting the catalyst layer with a mixed gas containing carbon and thus performing deposition by chemical vapor deposition (CVD); transferring the formed graphene on the silicon quantum dot layer; and doping graphene by spin-coating AuCl₃ at a concentration of 10 to 30 mM, and performing annealing at 90° C. to 110° C.

\* \* \* \* \*